(12) United States Patent
Fujiwara

(10) Patent No.: US 11,033,929 B2
(45) Date of Patent: Jun. 15, 2021

(54) APPLICATION METHOD

(71) Applicant: SCREEN Holdings Co., Ltd., Kyoto (JP)

(72) Inventor: Naozumi Fujiwara, Kyoto (JP)

(73) Assignee: SCREEN Holdings Co., Ltd.

( * ) Notice: Subject to any disclaimer, the term of this patent is extended or adjusted under 35 U.S.C. 154(b) by 60 days.

(21) Appl. No.: 15/807,643

(22) Filed: Nov. 9, 2017

(65) Prior Publication Data

US 2018/0133748 A1 May 17, 2018

(30) Foreign Application Priority Data

Nov. 15, 2016 (JP) .............................. JP2016-222223

(51) Int. Cl.
*B05D 1/00* (2006.01)
*H01L 21/67* (2006.01)
*B08B 3/08* (2006.01)

(52) U.S. Cl.
CPC .............. *B05D 1/002* (2013.01); *B08B 3/08* (2013.01); *H01L 21/67023* (2013.01); *H01L 21/67051* (2013.01)

(58) Field of Classification Search
CPC .. B05D 1/02; B05D 1/005; B08B 3/08; H01L 21/67023; H01L 21/67051; H01L 21/6715
USPC ........................................................ 427/240
See application file for complete search history.

(56) References Cited

U.S. PATENT DOCUMENTS

| 2004/0038060 A1* | 2/2004 | Kawakami | ............ B81C 1/0092 |
| | | | 428/520 |
| 2005/0051930 A1* | 3/2005 | Kawakami | .......... B81C 1/00841 |
| | | | 264/341 |
| 2005/0224923 A1* | 10/2005 | Daley | ....................... G03F 7/40 |
| | | | 257/642 |

(Continued)

FOREIGN PATENT DOCUMENTS

| JP | 2000-311846 A | 11/2000 |
| JP | 2004-140321 A | 5/2004 |

(Continued)

OTHER PUBLICATIONS

Office Action dated Oct. 28, 2019 in counterpart Korean Patent Application No. 10-2017-0150476.

(Continued)

*Primary Examiner* — Kelly M Gambetta
(74) *Attorney, Agent, or Firm* — Ostrolenk Faber LLP

(57) ABSTRACT

For a substrate having a diameter of 300 millimeters and a main surface on which a lot of pattern elements standing upright are formed, a processing using a processing liquid is performed on the main surface. After the processing using the processing liquid, a filler solution is applied onto the main surface. In the application process of the filler solution, pure water is supplied onto the main surface which faces upward while the substrate is in a horizontal state, and a liquid film of the pure water which covers the main surface and has a thickness not larger than 5 micrometers is formed by rotating the substrate. Then, the filler solution containing a water-soluble filler is supplied onto a center portion of the main surface while the substrate is rotated at the number of rotation not smaller than 300 times and not larger than 500 times per minute.

8 Claims, 8 Drawing Sheets

(56) References Cited

U.S. PATENT DOCUMENTS

| | | | | |
|---|---|---|---|---|
| 2008/0176172 A1* | 7/2008 | Funakoshi | ............ | G03F 7/3021 |
| | | | | 430/313 |
| 2016/0336169 A1* | 11/2016 | Fujiwara | .................. | B08B 3/08 |
| 2018/0085780 A1* | 3/2018 | Kanematsu | ............. | H01L 21/06 |

FOREIGN PATENT DOCUMENTS

| JP | 2008-130685 A | 6/2008 |
|---|---|---|
| JP | 2011-124313 A | 6/2011 |
| JP | 2012-243869 A | 12/2012 |
| JP | 2013-258272 A | 12/2013 |
| JP | 2015-023172 A | 2/2015 |
| JP | 2015-211066 | 11/2015 |

OTHER PUBLICATIONS

Notice of Reasons for Refusal dated Jul. 2, 2020 for Japanese Patent Application No. 2016-222223.
Notice of Final Rejection dated Jun. 11, 2020 in counterpart Korean Patent Application No. 10-2017-0150476.
Decision of Rejection for Amendment dated Jun. 11, 2020 in counterpart Korean Patent Application No. 10-2017-0150476.
Decision to Grant a Patent dated Apr. 1, 2021 for corresponding Japanese Patent Application No. 2016-222223 and machine translation.

* cited by examiner

FIG. 5
|     | 200rpm | 300rpm | 400rpm | 500rpm | 600rpm |
|-----|--------|--------|--------|--------|--------|
| 7um | ×      | ×      | ×      | ×      | ×      |
| 5um | ×      | ○      | ○      | ○      | OUTER PERIPHERY NG |
| 3um | ×      | ○      | ○      | ○      | OUTER PERIPHERY NG |
FIG. 6
FIG. 7

FIG. 8

|      | 3.2cp | 3.0cp | 2.8cp | 2.6cp |
|------|-------|-------|-------|-------|
| 7um  | ×     | ×     | ×     | ×     |
| 5um  | ×     | ○     | ○     | ○     |
| 3um  | ×     | ○     | ○     | ○     |

FIG. 9

|       | 200rpm | 300rpm | 400rpm | 500rpm | 600rpm           |
|-------|--------|--------|--------|--------|------------------|
| 3.2cp | ×      | ×      | ×      | ×      | ×                |
| 3.0cp | ×      | ○      | ○      | ○      | OUTER PERIPHERY NG |
| 2.8cp | ×      | ○      | ○      | ○      | OUTER PERIPHERY NG |
| 2.6cp | ×      | ○      | ○      | ○      | OUTER PERIPHERY NG |

FIG. 10

|      | 1cc/sec | 2cc/sec | 3cc/sec |
|------|---------|---------|---------|
| 7um  | ×       | ×       | ×       |
| 5um  | ×       | ○       | ○       |
| 3um  | ×       | ○       | ○       |

FIG. 11

|         | 200rpm | 300rpm | 400rpm | 500rpm | 600rpm           |
|---------|--------|--------|--------|--------|------------------|
| 1cc/sec | ×      | ×      | ×      | ×      | ×                |
| 2cc/sec | ×      | ○      | ○      | ○      | OUTER PERIPHERY NG |
| 3cc/sec | ×      | ○      | ○      | ○      | OUTER PERIPHERY NG |

FIG. 12

|         | 3.2cp | 3.0cp | 2.8cp | 2.6cp |
|---------|-------|-------|-------|-------|
| 1cc/sec | ×     | ×     | ×     | ×     |
| 2cc/sec | ×     | ○     | ○     | ○     |
| 3cc/sec | ×     | ○     | ○     | ○     |

APPLICATION METHOD

TECHNICAL FIELD

The present invention relates to an application method of a filler solution.

BACKGROUND ART

In a process of manufacturing a semiconductor substrate (hereinafter, referred to simply as a "substrate"), conventionally, substrate processing apparatuses have been used for performing various processings on the substrate. By supplying a chemical liquid onto a substrate having a surface on which a resist pattern is formed, for example, a processing such as etching or the like is performed on the surface of the substrate. After supplying the chemical liquid, a rinse process in which pure water is supplied onto the substrate, to thereby removing the chemical liquid from the surface and a drying process in which the substrate is rotated at high speed, to thereby removing the pure water from the surface are further performed.

In a case where a lot of fine pattern elements are formed on the surface of the substrate, when the rinse process and the drying process as described above are performed in this order, at some midpoint of the drying, a liquid surface of pure water is formed between two adjacent pattern elements. In this case, the surface tension of the pure water acts on the pattern elements, and there is a possibility that the pattern elements may be collapsed. Then, Japanese Patent Application Laid-Open No. 2011-124313 discloses a method in which a rinse liquid remaining in a recessed portion formed between the pattern elements of a circuit pattern of the substrate is replaced by a filler (polymer) and the recessed portion is filled and solidified with the filler, and then the filler is removed from the surface of the substrate by a plasma treatment.

Further, Japanese Patent Application Laid-Open No. 2013-258272 discloses a method in which a rinse liquid adhering to a surface of a substrate on which a convex pattern is formed is replaced by a solution in which a solute is dissolved in a solvent and subsequently the solvent is evaporated, to thereby deposit the solute on the surface of the substrate, and then the deposited solute is sublimated. The drying method as described above in which a filler solution fills between a lot of pattern elements and a film of the solidified filler is sublimated by dry etching or the like is also referred to as "Sacrificial Polymer Fill (SPF)"

In a case where a water-insoluble filler solution is supplied onto an upper surface of a substrate after being subjected to a rinse process, to which pure water adheres, the filler is deposited ununiformly (the filler does not make a uniform film) when the solution is mixed with the pure water. Therefore, it is necessary to replace the pure water on the upper surface after being subjected to the rinse process by IPA (isopropyl alcohol) before supplying the solution. On the other hand, in another case where a water-soluble filler solution is supplied, since no IPA replacement is needed, it is possible to increase throughput regarding the drying process.

When the filler solution containing a water-soluble filler is supplied on a liquid film of pure water on the upper surface, however, a partial region on the upper surface is dried by flocculation of water and collapse of the pattern elements may occur. Further, the thickness of the filler at an outer peripheral portion of the substrate may become excessively larger than that at an inner peripheral portion, and in this case, the efficiency of the following process of removing the filler is lowered. Therefore, required is a method which makes it possible to appropriately apply the filler solution onto the upper surface of the substrate after being subjected to a processing using a processing liquid.

SUMMARY OF INVENTION

The present invention is intended for an application method of applying a filler solution onto a main surface of a substrate on which a pattern is formed after performing a processing on the main surface by using a processing liquid, and it is an object of the present invention to appropriately apply the filler solution onto the main surface of the substrate after being subjected to the processing using the processing liquid.

The application method according to the present invention includes: a) supplying pure water onto a main surface of a substrate, which faces upward while the substrate is in a horizontal state, on which a lot of pattern elements standing upright are formed, and forming a liquid film of pure water, which covers the main surface and has a thickness not larger than 5 micrometers, by rotating the substrate; and b) supplying a filler solution containing a water-soluble filler onto a center portion of the main surface while rotating the substrate having a diameter of 300 millimeters at the number of rotation not smaller than 300 times and not larger than 500 times per minute.

By the present invention, it is possible to appropriately apply the filler solution onto the main surface of the substrate after being subjected to the processing using the processing liquid.

In one preferred embodiment of the present invention, the filler solution has a viscosity not higher than 3 centipoises.

In another preferred embodiment of the present invention, the filler solution is supplied onto the main surface at a flow rate not lower than 2 cubic centimeters per second in the operation b).

These and other objects, features, aspects and advantages of the present invention will become more apparent from the following detailed description of the present invention when taken in conjunction with the accompanying drawings.

BRIEF DESCRIPTION OF DRAWINGS

FIG. 5 is a view showing a relation between a thickness of a liquid film of pure water and the number of application rotation, and an application result of a filler solution;

FIG. 6 is a photo showing a substrate on which a spike failure occurs;

FIG. 7 is a photo showing a substrate on which an outer periphery film thickness failure occurs;

FIG. 8 is a view showing a relation between a thickness of a liquid film of pure water and a viscosity of a filler solution, and an application result of the filler solution;

FIG. 9 is view showing a relation between a viscosity of a filler solution and the number of application rotation, and an application result of the filler solution;

FIG. 10 is a view showing a relation between a thickness of a liquid film of pure water and a discharge flow rate of a filler solution, and an application result of the filler solution;

FIG. 11 is a view showing a relation between a discharge flow rate of a filler solution and the number of application rotation, and an application result of the filler solution;

FIG. 12 is a view showing a relation between a discharge flow rate and a viscosity of a filler solution, and an application result of the filler solution.

DESCRIPTION OF EMBODIMENTS

Figure 1:
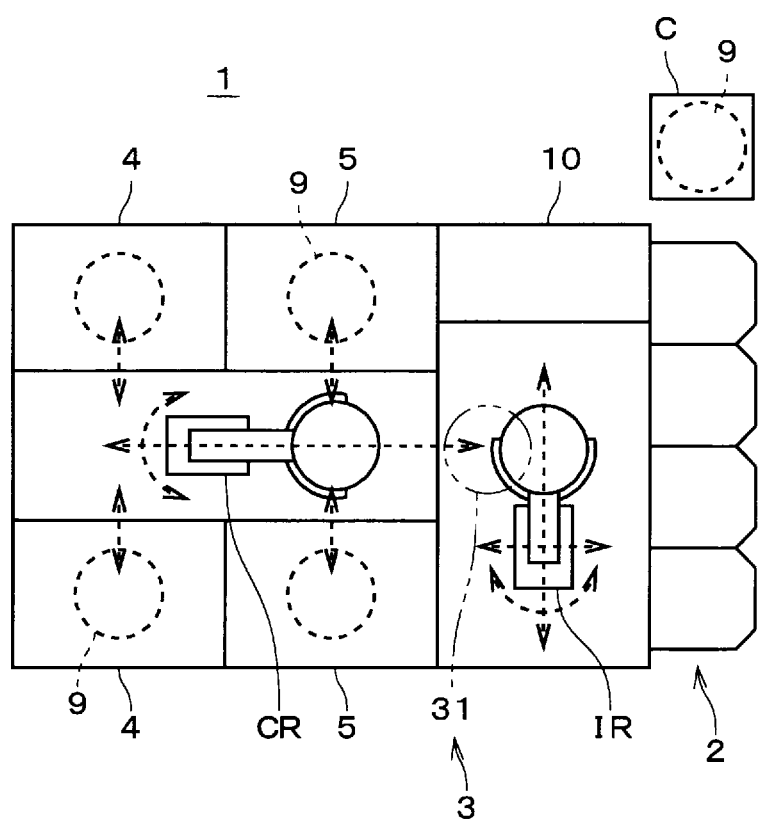
FIG. 1 is a plan view showing a configuration of a substrate processing apparatus.

FIG. 1 is a plan view showing a configuration of a substrate processing apparatus 1 in accordance with one preferred embodiment of the present invention. The substrate processing apparatus 1 includes a carrier holding part 2, a substrate passing part 3, an indexer robot IR, a center robot CR, two cleaning units 4, two thermal processing units 5, and a control part 10.

A carrier C is a container capable of accommodating a plurality of substrates, being stacked. The carrier C accommodates unprocessed substrates and processed substrates. The substrate 9 in the present preferred embodiment has a disk-like shape and a diameter of 300 millimeters (mm). The carrier holding part 2 supports a plurality of carriers C.

As conceptually indicated by a broken-line arrow in FIG. 1, the indexer robot IR is capable of transferring the substrate 9 to an arbitrary position by using an arm thereof which is rotatable and movable to and fro while holding the substrate 9. The indexer robot IR is movable to and fro also in an up-and-down direction while holding the substrate 9. An unprocessed substrate 9 in the carrier C placed on the carrier holding part 2 is transferred to a pass 31 of the substrate passing part 3 by the indexer robot IR. The pass 31 serves as a buffer which temporarily stores the plurality of substrates 9. A processed substrate 9 placed on the pass 31 is transferred to the inside of the carrier C placed on the carrier holding part 2 by the indexer robot IR. In FIG. 1, for convenience of illustration, the pass 31 is represented by a two-dot chain line.

The center robot CR is capable of transferring the substrate 9 to an arbitrary position by using an arm thereof which is rotatable and movable to and fro while holding the substrate 9. The center robot CR transfers the substrate 9 between the pass 31 of the substrate passing part 3, the cleaning units 4, and the thermal processing units 5 by this operation.

The thermal processing unit 5 has, for example, a hot plate. The substrate 9 after being subjected to a later-described processing in the cleaning unit 4 is placed on the hot plate through the center robot CR. The substrate 9 is thereby heated to a predetermined temperature. The heating of the substrate 9 in the thermal processing unit 5 may be performed by any other method such as irradiation of infrared ray by a lamp, application of hot air, or the like.

Figure 2:
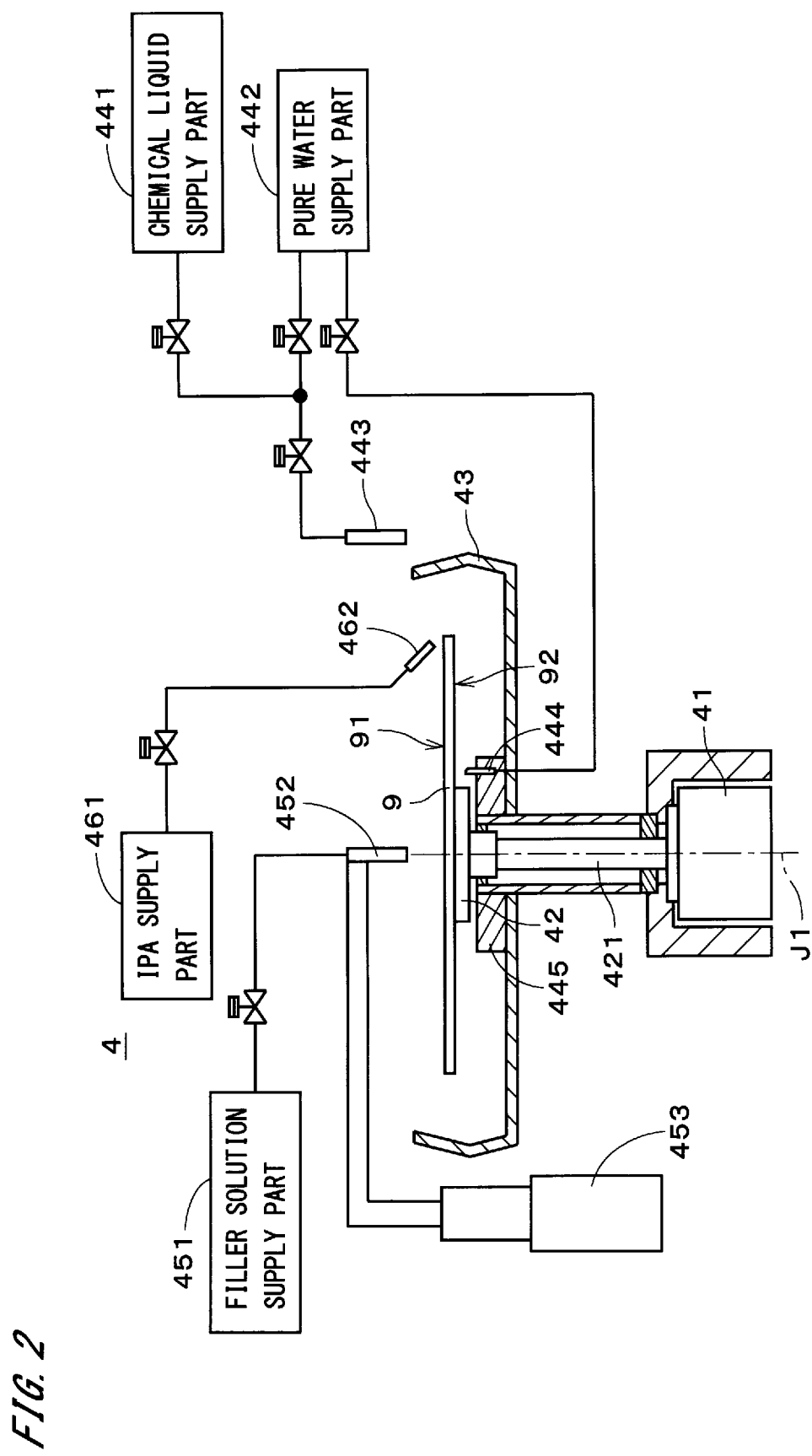
FIG. 2 is a view showing a configuration of a cleaning unit.

FIG. 2 is a view showing a configuration of the cleaning unit 4. The cleaning unit 4 includes a spin chuck 42 which is a substrate holding part, a spin motor 41 which is a substrate rotating mechanism, and a cup 43 surrounding a periphery of the spin chuck 42. The unprocessed substrate 9 which is passed from the center robot CR is placed on the spin chuck 42. The spin chuck 42 has a plurality of not-shown suction holes on its upper surface and a lower surface 92 which is one main surface of the substrate 9 is absorbed by the plurality of suction holes. The substrate 9 is thereby held by the spin chuck 42 in a horizontal state (in other words, in a horizontal position). To a lower surface of the spin chuck 42, connected is a shaft 421 extending in the up-and-down direction (vertical direction). A central axis J1 of the shaft 421 passes a center of the substrate 9. The spin motor 41 rotates the shaft 421. The spin chuck 42 and the substrate 9 are thereby rotated around the central axis J1. Further, the structure of the spin chuck 42 is not limited to one for absorbing the back surface of the substrate 9, and the spin chuck 42 may have, for example, a structure for grasping the substrate 9 by bringing a plurality of grasping members into contact with a peripheral edge of the substrate 9, or the like.

The cleaning unit 4 further includes a chemical liquid supply part 441, a pure water supply part 442, a first nozzle 443, a lower nozzle 444, a filler solution supply part 451, a second nozzle 452, a second nozzle moving mechanism 453, an IPA supply part 461, and a third nozzle 462. The filler solution supply part 451 is connected to the second nozzle 452 through a valve. The chemical liquid supply part 441 is connected to the first nozzle 443 through a valve. The pure water supply part 442 is connected to the first nozzle 443 through a valve. The pure water supply part 442 is connected to the lower nozzle 444 through a valve. The IPA supply part 461 is connected to the third nozzle 462 through a valve.

The second nozzle moving mechanism 453 selectively arranges the second nozzle 452 at a facing position which faces an upper surface 91 (another main surface) of the substrate 9 or a waiting position away from the substrate 9 in a horizontal direction. A not-shown first nozzle moving mechanism also selectively arranges the first nozzle 443 at a position which faces the upper surface 91 of the substrate 9 or another waiting position away from the substrate 9 in the horizontal direction. Similarly, a not-shown third nozzle moving mechanism also selectively arranges the third nozzle 462 at a position which faces an outer edge portion of the upper surface 91 of the substrate 9 or the other waiting position away from the substrate 9 in the horizontal direction. The lower nozzle 444 is attached onto a supporting mount 445 positioned below the spin chuck 42.

Figure 3:
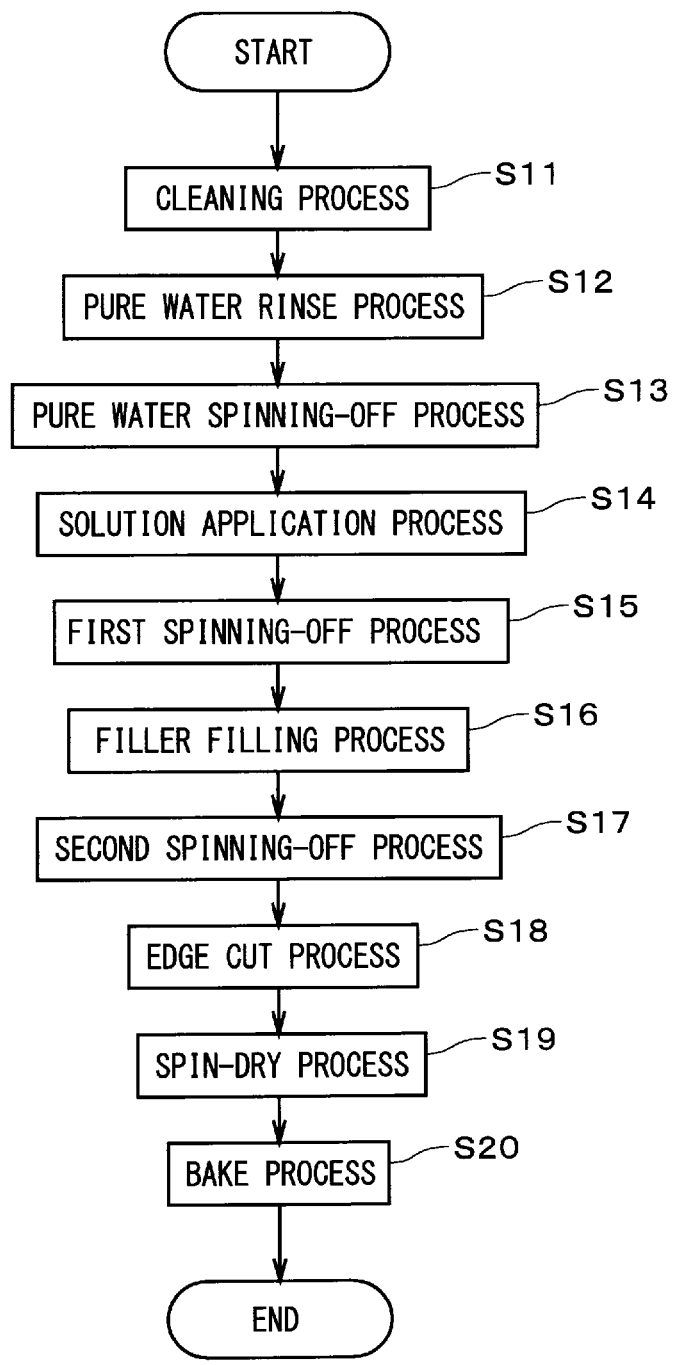
FIG. 3 is a flowchart showing an operation flow for processing a substrate.
Figure 4:
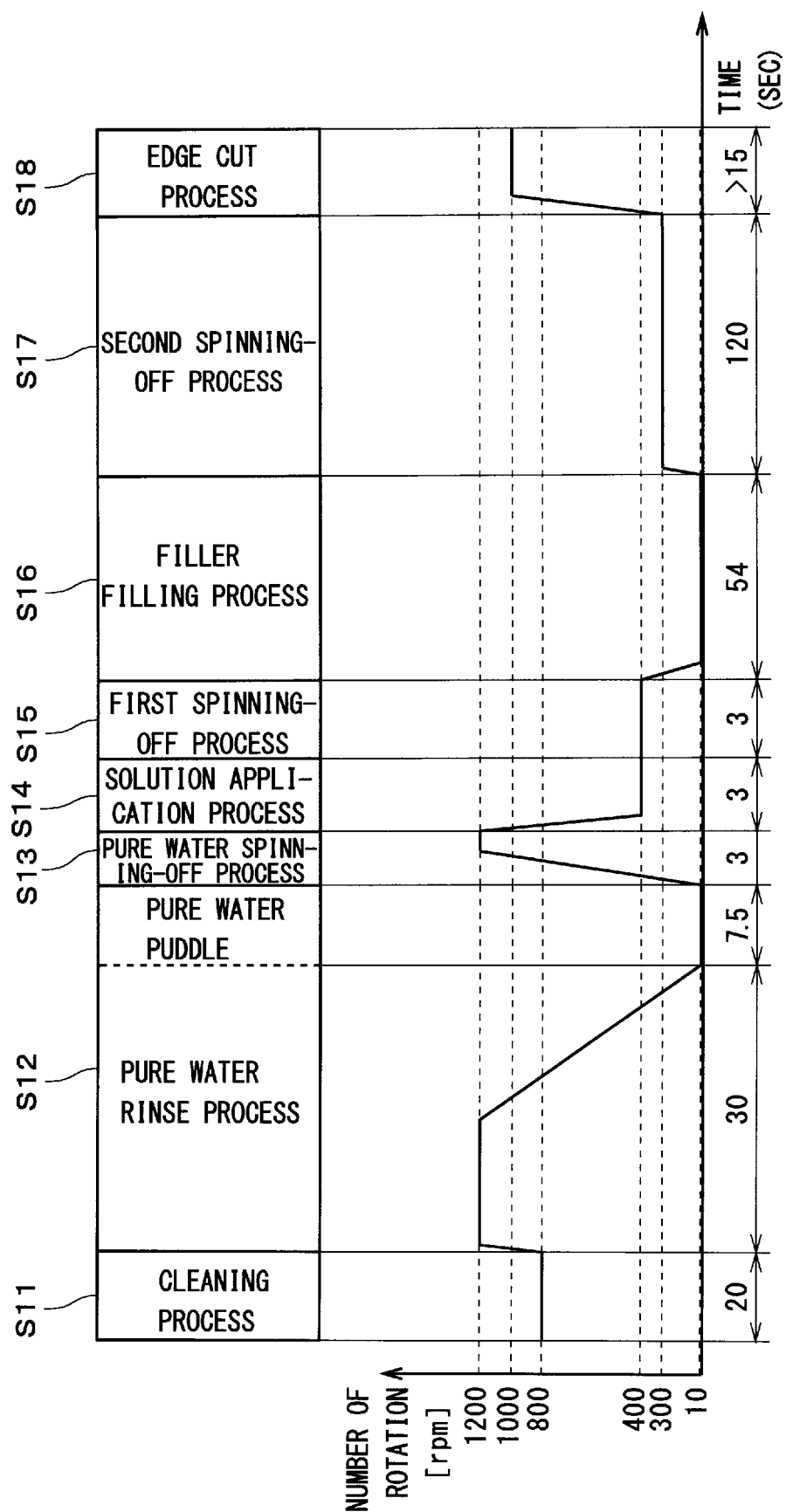
FIG. 4 is a view showing a change in the number of rotation of the substrate in a substrate processing.

FIG. 3 is a flowchart showing an operation flow for processing the substrate 9 in the substrate processing apparatus 1. FIG. 4 is a view showing a change in the number of rotation of the substrate 9 in part of a substrate processing. The upper stage of FIG. 4 indicates respective contents of various processes for the substrate 9 and the lower stage thereof indicates the number of rotation (rotation speed) of the substrate 9 in these processes (the same applies to FIG. 13 described later). The number of rotation of the substrate 9 and the time of each process shown in FIG. 4 are only one example and may be changed as appropriate.

In the substrate processing apparatus 1, first, an unprocessed substrate 9 inside carrier C is transferred to the inside of the cleaning unit 4 by the indexer robot IR and the center robot CR. In the cleaning unit 4 of FIG. 2, the lower surface 92 of the substrate 9 is held by the spin chuck 42, and the upper surface 91 of the substrate 9 faces upward. On the upper surface 91 of the substrate 9, a pattern is formed. The pattern includes a lot of pattern elements. Each pattern element has a pillar shape standing upright on the upper surface 91 and has a high aspect ratio. The substrate 9 is used, for example, for manufacturing a memory having a pillar structure. The substrate 9 may be provided with a plurality of bridges extending along the upper surface 91. In a lot of pattern elements, each bridge connects tips of the adjacent pattern elements to each other in a transverse direction.

In the cleaning unit 4, first, a processing using a chemical liquid is performed on the upper surface 91 of the substrate 9 (Step S11). In the processing using the chemical liquid, the first nozzle moving mechanism arranges the first nozzle 443 at the position facing the upper surface 91 of the substrate 9. Further, the spin motor 41 starts rotation of the substrate 9 at a predetermined number of rotation. In the exemplary case of FIG. 4, the number of rotation of the substrate 9 is 800 rpm (i.e., 800 times per minute). Then, the chemical liquid supply part 441 continuously supplies the chemical liquid onto the upper surface 91 through the first nozzle 443. The chemical liquid spattering from the upper surface 91 of the substrate 9, being rotated, is received and collected by the cup 43. In the present exemplary processing, the chemical liquid is a cleaning solution containing dilute hydrofluoric acid (DHF) or aqueous ammonia. Specifically, in Step S11, a cleaning process using the chemical liquid as a processing liquid is performed. The supply of the chemical liquid continues for a predetermined time. Further, in the processing using the chemical liquid and a later-described processing using pure water, the first nozzle 443 may be oscillated by the first nozzle moving mechanism in the horizontal direction.

After the processing using the chemical liquid is completed, the pure water supply part 442 supplies pure water (deionized water) onto the upper surface 91 through the first nozzle 443 (Step S12). The chemical liquid on the upper surface 91 is thereby rinsed off by the pure water. Specifically, in Step S12, a rinse process using pure water as a processing liquid is performed. In the rinse process, for example, pure water of 2 liters per minute (L/min) is continuously supplied onto the upper surface 91. In the rinse process in the exemplary case of FIG. 4, the number of rotation of the substrate 9 is kept at 1200 rpm for a predetermined time, and subsequently, is gradually lowered to 10 rpm. After that, the number of rotation is kept at 10 rpm for a predetermined time. During a period while the number of rotation of the substrate 9 is 10 rpm, a liquid film (puddle) of the pure water covering the upper surface 91 is formed and kept. Thus, the rinse process of the present exemplary processing includes a pure water puddle in which the puddle of the pure water is formed. The supply of the pure water continues for a predetermined time, and after that, is stopped. Concurrently with Steps S11 and S12, the pure water may be supplied onto the lower surface 92 through the lower nozzle 444 by the pure water supply part 442.

When the supply of the pure water onto the upper surface 91 is stopped, the first nozzle moving mechanism moves the first nozzle 443 to the waiting position. Further, the second nozzle moving mechanism 453 arranges the second nozzle 452 at the facing position which faces a center portion of the upper surface 91. Further, the number of rotation of the substrate 9 is increased to 1200 rpm in a short time and kept for a predetermined time. A spinning-off process of the pure water is thereby performed (Step S13). In the spinning-off process of the pure water, the thickness of the liquid film, i.e., the amount of pure water remaining on the upper surface 91 is reduced while the liquid film of the pure water entirely covering the upper surface 91 is kept. In the present exemplary processing, the thickness of the liquid film of the pure water after the spinning-off process is 3.5 micrometers (μm). As described above, in Steps S12 and S13, a thin liquid film of the pure water is formed by supplying the pure water onto the upper surface 91 of the substrate 9 and rotating the substrate 9.

After the spinning-off process of the pure water is completed, the number of rotation of the substrate 9 is reduced to a predetermined value (hereinafter, also referred to as the "number of application rotation") and kept. In the exemplary case of FIG. 4, the number of application rotation is 400 rpm. Further, the filler solution supply part 451 continuously supplies the filler solution of room temperature onto the center portion of the upper surface 91 through the second nozzle 452 disposed at the facing position for a predetermined time (three seconds in the exemplary case of FIG. 4) (Step S14). In the present exemplary processing, the filler solution is discharged from the second nozzle 452 at a flow rate of 3 cubic centimeters per second (cc/sec). The processes in Steps S14 and later-described Steps S15 to S16 are performed under a room temperature environment. Further, in Step S14, it is preferable that the pure water supply part 442 should supply the pure water onto the lower surface 92 through the lower nozzle 444. It is thereby possible to prevent the filler solution from going around to the side of the lower surface 92.

On the upper surface 91 of the substrate 9 rotating at the number of application rotation, the filler solution supplied onto the liquid film of the pure water spreads from the center portion thereof toward the entire outer peripheral portion. Further, kept is a state in which the filler solution is homogeneous from the center portion of the upper surface 91 toward the outer peripheral portion. Thus, the filler solution is appropriately applied entirely onto the upper surface 91. In the present exemplary processing, also after the supply of the filler solution is completed, the rotation of the substrate 9 at the number of application rotation continues for only a predetermined time (three seconds in the exemplary case of FIG. 4), and superfluous filler solution (containing pure water) on the upper surface 91 is removed. In other words, the spinning-off process of the filler solution is performed (Step S15). In the present exemplary processing, since the spinning-off process of the filler solution is repeated in Step S17 described later, hereinafter, the spinning-off process of the filler solution in Step S15 is referred to as a "first spinning-off process" and the spinning-off process of the filler solution in Step S17 is referred to as a "second spinning-off process".

Herein, description will be made on the filler solution. The filler solution in the present preferred embodiment is a solution in which a filler which is water-soluble polymer such as an acrylic resin or the like is dissolved in a solvent (for example, water). As the concentration of the filler in the filler solution becomes higher, the viscosity of the filler solution increases. In the filler solution supply part 451, the concentration of the filler solution is adjusted to a predetermined value, and the viscosity (at the room temperature) of the filler solution to be supplied onto the upper surface 91 is thereby not higher than 3 centipoises (cp) (0.003 pascal seconds). In the present exemplary processing, the viscosity of the filler solution is about 2.8 cp. It is assumed that the filler causes a crosslinking reaction, for example, by being heated up to not lower than a predetermined temperature.

After the rotation of the substrate 9 at the number of application rotation is completed, the number of rotation of the substrate 9 is reduced to 10 rpm and kept for a predetermined time. At that time, a liquid film (puddle) of the filler solution is formed on the upper surface 91 (on the liquid film of the pure water). The liquid film is a continuous liquid layer covering the entire upper surface 91, and in the liquid film, formed is a state in which there is almost no relative movement along the upper surface 91 between the substrate 9 and the liquid (filler solution) forming the liquid film. As described early, the filler is water-soluble and the liquid film is kept on the upper surface 91 while the supply of the filler is stopped, and the filler is thereby also dissolved into the pure water (the pure water contained in the liquid film of the pure water) which is present in a clearance between the adjacent pattern elements. Thus, by keeping the puddle of the filler solution on the upper surface 91, the filler fills (is embedded into) the clearance between the pattern elements (Step S16).

After that, the number of rotation of the substrate 9 is increased to 300 rpm and kept for a predetermined time. The second spinning-off process of the filler solution is thereby performed (Step S17). In the second spinning-off process, the thickness of the liquid film is reduced while the liquid film of the filler solution covering the entire upper surface 91 of the substrate 9 is kept. Further, in the substrate processing apparatus 1, concurrently with Steps S15 to S17, the second nozzle 452 moves to the waiting position and the third nozzle 462 is arranged at the position facing the outer edge portion of the upper surface 91.

After the second spinning-off process is completed, the number of rotation of the substrate 9 is increased to 1000 rpm and kept for a predetermined time (for example, 120 seconds). Further, the IPA supply part 461 continuously supplies IPA onto the outer edge portion of the upper surface 91 through the third nozzle 462. An ejection direction of the IPA in the third nozzle 462 inclines from the downward orientation in the up-and-down direction to the outward orientation (toward a direction away from the central axis J1), and the IPA is supplied onto only the outer edge portion of the upper surface 91. The filler adhering to the outer edge portion of the upper surface 91 on which no pattern element is formed and to an end surface (edge surface) of the substrate 9 is removed along the entire circumference (Step S18). The process of removing the filler from the outer edge portion of the substrate 9 and the like is referred to as an "edge cut process". By removing the unnecessary filler adhering to the outer edge portion and the like, it is possible to prevent the arm of the center robot CR or the like from being contaminated at the time when the substrate 9 is transferred in the following processes. Further, concurrently with the supply of the IPA onto the outer edge portion, the pure water supply part 442 may supply pure water onto the lower surface 92 through the lower nozzle 444.

After the ejection of the IPA from the third nozzle 462 is completed, the number of rotation of the substrate 9 is increased to, for example, 1500 rpm and kept for a predetermined time (for example, 15 seconds). In other words, with high-speed rotation of the substrate 9, a spin-dry process of removing the IPA from the outer edge portion is performed (Step S19). After that, the rotation of the substrate 9 is stopped. By using the center robot CR shown in FIG. 1, the substrate 9 is unloaded from the cleaning unit 4, and subsequently loaded to the inside of the thermal processing unit 5. In the thermal processing unit 5, the substrate 9 is heated, for example, at 120° C. for one minute. Specifically, the substrate 9 is baked (Step S20), and a solvent component (herein, moisture) in the liquid film of the filler solution on the upper surface 91 is thereby removed and the filler is hardened (solidified). A film of the filler is thereby formed while the solidified filler fills between the adjacent pattern elements. In the present exemplary processing, the thickness of the film of the filler is about 400 nanometer (nm).

After that, the substrate 9 is unloaded from the thermal processing unit 5 by the center robot CR and returned to the inside of the carrier C through the indexer robot IR. The processing of the substrate 9 in the substrate processing apparatus 1 is thereby completed.

The substrate 9 filled with the filler is transferred to an external dry etching apparatus or an external ashing apparatus. Then, the filler is removed by dry etching or ashing (hereinafter, referred to as "dry etching or the like"). At that time, since the inclusion (filler) interposed between the adjacent pattern elements is solid, the filler is removed in a state where the surface tension of the inclusion does not act on the pattern elements. The above-described processes of Steps S13 to S20 and the removal process of the filler can be understood as a drying process of the pure water adhering to the upper surface 91, and by performing the above-described drying process, it is possible to prevent the pattern elements from being collapsed by the surface tension of the pure water during being dried. The removal of the filler may be performed by any other method using no liquid. For example, depending on the kind of filler, the filler is sublimated and removed by heating under reduced pressure.

Herein, a result of an experiment regarding the application of the filler solution will be described. In this experiment, the processing shown in FIG. 3 is performed while the thickness of the liquid film of the pure water after the pure water spinning-off process (Step S13) and the number of application rotation in the solution application process (Step S14) are changed to a plurality of possible values. FIG. 5 is a view showing a relation between a thickness of the liquid film of the pure water and the number of application rotation, and an application result of the filler solution. The sign "×" in FIG. 5 indicates that a spike failure described later occurs as the application result, "outer periphery NG" indicates that an outer periphery film thickness failure described later occurs, and the sign "◯" indicates that almost none of these failures occur (the same applies to FIGS. 8 to 12 described later). The discharge flow rate of the filler solution is 3 cc/sec and the viscosity of the filler solution is 2.6 cp.

FIG. 6 is a photo enlargedly showing a peripheral portion of the substrate 9 in which a spike failure occurs, and FIG. 7 is a photo enlargedly showing a peripheral portion of the substrate 9 in which an outer periphery film thickness failure occurs. Herein, the water-soluble filler has a property of causing flocculation of water, and in a case where the number of application rotation is 200 rpm, even when the liquid film of the pure water has any one of the thicknesses shown in FIG. 5, the flocculation of water causes a partial region of the upper surface 91 to dry in the solution application process and the first spinning-off process (Steps S14 and S15). As shown in FIG. 6, the region has a shape like a spike pointed toward the center of the substrate 9, and herein the region is referred to as a "spike failure". When the spike failure occurs, the pattern elements are collapsed due to the surface tension of water. Also in a case where the thickness of the liquid film of the pure water is 7 μm, regardless of the number of application rotation, the spike failure occurs. In a case where the number of application rotation is not smaller than 300 rpm and the thickness of the liquid film of the pure water is not larger than 5 μm, almost no spike failure occurs.

Though the cause of the spike failure is uncertain, it is thought that the spike failure become liable to occur when the degree (coverage) to which the filler solution can cover the liquid film of the pure water is low in the solution application process. When the number of application rotathe pure water is larger, the above-described degree becomes lower. Therefore, from the viewpoint of suppressing the spike failure, it is preferable that the number of application rotation should be made larger and the thickness of the liquid film of the pure water should be made smaller. Actually, as the number of application rotation becomes larger and as the thickness of the liquid film of the pure water becomes smaller, the total area of the spike-like region becomes smaller. On the other hand, when the thickness of the liquid film of the pure water becomes almost as small as the height of the pattern element, the pattern elements are collapsed due to the effect of the surface tension. Therefore, it is preferable that the thickness of the liquid film of the pure water should be larger than the height of the pattern element on the upper surface 91, and for example, should be not smaller than 2 μm.

Further, even under the condition that the spike failure can be suppressed, when the number of application rotation increases up to 600 rpm, the outer periphery film thickness failure occurs. The outer periphery film thickness failure is a phenomenon in which the thickness (film thickness) of the filler at the outer peripheral portion of the upper surface 91 becomes excessively larger (for example, two times or more) than that of the center portion. Actually, as shown in FIG. 7, a foggy interference fringe is observed at the outer peripheral portion of the substrate 9. In the outer periphery film thickness failure, the variation in the film thickness of the filler in a radial direction at the outer peripheral portion becomes larger (in other words, the roughness or the projections and depressions become larger). Since the processing time is determined in accordance with the largest film thickness of the filler on the upper surface 91 in the removal of the filler by dry etching or the like, the occurrence of the outer periphery film thickness failure elongates the time required for the dry etching or the like. Further, the pattern elements are sometimes collapsed due to the effect of the internal stress of the substrate 9, which is caused by the variation in the film thickness of the filler. When the number of application rotation is not larger than 500 rpm, the difference between the film thickness of the filler at the outer peripheral portion and that of the filler at the center portion becomes smaller, and almost no outer periphery film thickness failure occurs.

Though the cause of the outer periphery film thickness failure is uncertain, it is thought that one cause is that the drying rate of the solvent of the filler solution at the outer peripheral portion becomes excessively higher than that at the center portion when the number of application rotation is too large. In this case, the viscosity of the filler solution becomes higher at the outer peripheral portion than that at the center portion and it becomes harder for the filler solution to move due to the centrifugal force. This increases the film thickness of the filler and the variation in the film thickness at the outer peripheral portion. At the center portion, since the viscosity of the filler solution is relatively low, it is easy for the filler solution to move and the film thickness of the filler becomes smaller. In other words, when the number of application rotation is not larger than 500 rpm, the difference in the drying rate of the solvent of the filler solution between at the outer peripheral portion and at the center portion of the upper surface 91 becomes smaller, and the difference in the film thickness of the filler also becomes smaller. Therefore, from the viewpoint of suppressing the outer periphery film thickness failure, it is preferable that the number of application rotation should be made smaller.

Thus, after the processing using the processing liquid on the upper surface 91 of the substrate 9 on which a pattern is formed, in the application process of applying the filler solution onto the upper surface 91, the liquid film of the pure water which covers the upper surface 91 and has a thickness not larger than 5 μm (i.e., a thickness equal to or smaller than 5 μm), is formed. Then, the filler solution containing the water-soluble filler is supplied onto the center portion of the upper surface 91 while the substrate 9 is rotated at the number of rotation not smaller than 300 times and not larger than 500 times per minute (i.e., the number of rotation equal to or larger than 300 times and equal to or smaller than 500 times per minute). It is thereby possible to apply the filler solution onto the upper surface 91 of the substrate 9 after being subjected to the processing using the processing liquid while suppressing the occurrence of the spike failure and the outer periphery film thickness failure.

Next, an experiment regarding the viscosity of the filler solution will be described. FIG. 8 is a view showing a relation between a thickness of the liquid film of the pure water and a viscosity of the filler solution, and an application result of the filler solution. Herein, the number of application rotation is 400 rpm and the discharge flow rate of the filler solution is 3 cc/sec. It can be seen from FIG. 8 that in a case where the thickness of the liquid film of the pure water is not larger than 5 μm, when the viscosity of the filler solution is not higher than 3.0 cp, (almost) neither spike failure nor outer periphery film thickness failure occurs.

FIG. 9 is a view showing a relation between a viscosity of the filler solution and the number of application rotation, and an application result of the filler solution. Herein, the thickness of the liquid film of the pure water is 3 μm and the discharge flow rate of the filler solution is 3 cc/sec. It can be seen from FIG. 9 that in a case where the number of application rotation ranges from 300 to 500 rpm, when the viscosity of the filler solution is not higher than 3.0 cp, neither spike failure nor outer periphery film thickness failure occurs.

Thus, in the case where the thickness of the liquid film of the pure water is not larger than 5 μm and the number of application rotation ranges from 300 to 500 rpm, if the viscosity of the filler solution is not excessively high (for example, not excessively high as compared with the viscosity of water), it is possible to suppress the occurrence of the spike failure and the outer periphery film thickness failure. Preferably, the viscosity of the filler solution is not higher than 3 centipoises. Actually, as the viscosity of the filler solution is lower, the spike failure and the outer periphery film thickness failure can be suppressed more. In a case where the solvent of the filler solution is water, for example, the viscosity of the filler solution is higher than that of water.

Next, an experiment regarding the discharge flow rate of the filler solution will be described. FIG. 10 is a view showing a relation between a thickness of the liquid film of the pure water and a discharge flow rate of the filler solution, and an application result of the filler solution. Herein, the number of application rotation is 400 rpm and the viscosity of the filler solution is 2.6 cp. It can be seen from FIG. 10 that in a case where the thickness of the liquid film of the pure water is not larger than 5 μm, when the discharge flow rate of the filler solution is not lower than 2 cc/sec, neither spike failure nor outer periphery film thickness failure occurs.

FIG. 11 is a view showing a relation between a discharge flow rate of the filler solution and the number of application rotation, and an application result of the filler solution. Herein, the thickness of the liquid film of the pure water is 3 μm and the viscosity of the filler solution is 2.6 cp. It can be seen from FIG. 11 that in a case where the number of application rotation ranges from 300 to 500 rpm, when the discharge flow rate of the filler solution is not lower than 2 cc/sec, neither spike failure nor outer periphery film thickness failure occurs.

Thus, in the case where the thickness of the liquid film of the pure water is not larger than 5 μm and the number of application rotation ranges from 300 to 500 rpm, if the discharge flow rate of the filler solution is not excessively low, it is possible to suppress the occurrence of the spike failure and the outer periphery film thickness failure. Preferably, the filler solution is supplied onto the upper surface 91 at the flow rate not lower than 2 cubic centimeters per second. Actually, as the discharge flow rate of the filler solution is higher, the spike failure can be suppressed more. Further, from the viewpoint of suppressing the usage of the filler solution and reducing the processing cost regarding the application of the filler solution, it is preferable that the discharge flow rate of the filler solution should be not higher than 3 cc/sec.

FIG. 12 is a view showing a relation between a discharge flow rate and a viscosity of the filler solution, and an application result of the filler solution. Herein, the thickness of the liquid film of the pure water is 3 μm and the number of application rotation is 400 rpm. It can be seen from FIG. 12 that in a case where the discharge flow rate of the filler solution is not lower than 2 cc/sec and the viscosity of the filler solution is not higher than 3 cp, neither spike failure nor outer periphery film thickness failure occurs. From FIGS. 5 and 8 to 12, it is more preferable that the four conditions, i.e., the thickness of the liquid film of the pure water is not larger than 5 μm, the number of application rotation ranges from 300 to 500 rpm, the viscosity of the filler solution is not higher than 3 cp, and the discharge flow rate of the filler solution is not lower than 2 cc/sec should be satisfied at the same time in the application of the filler solution.

Figure 13:
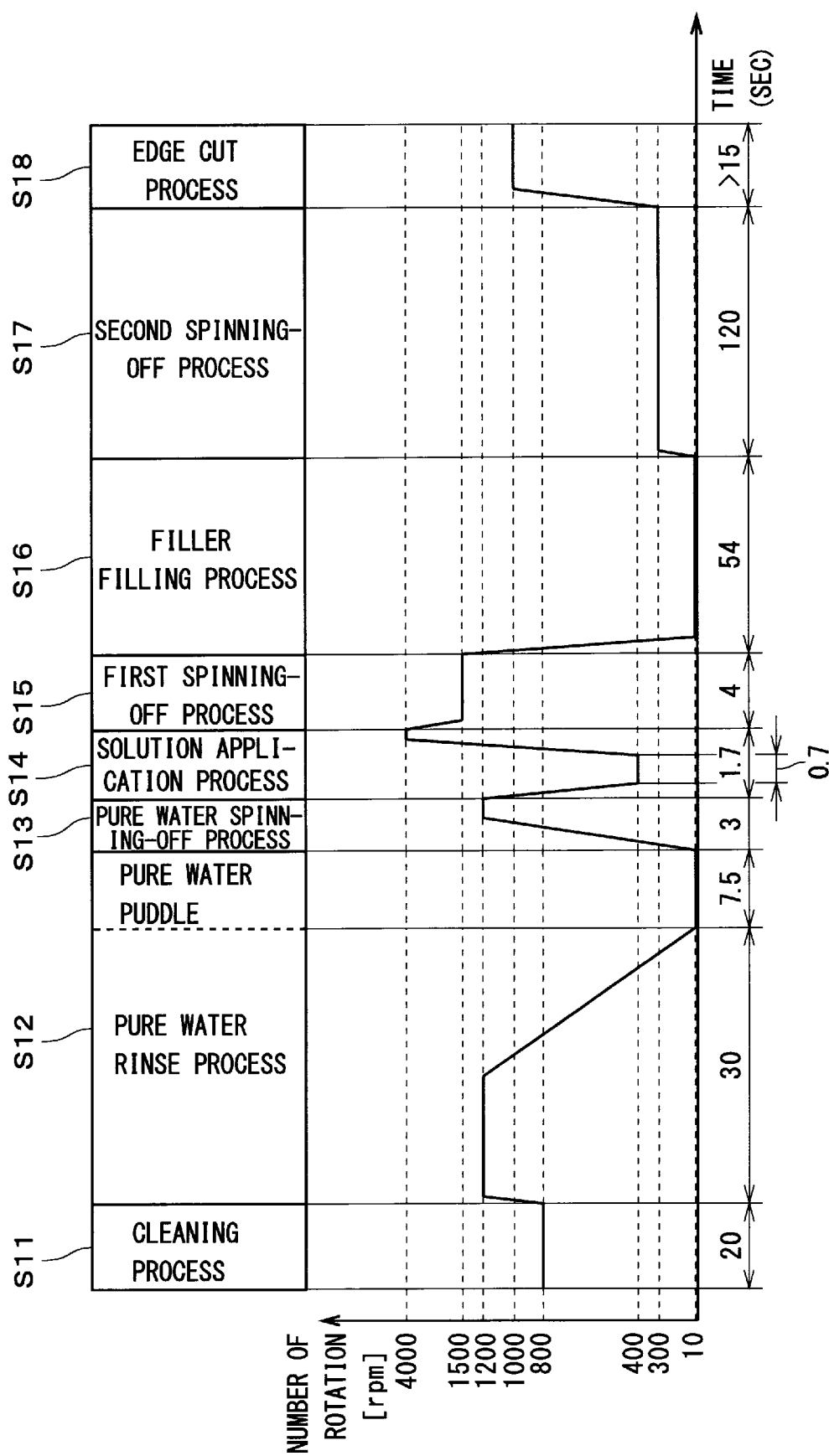
FIG. 13 is a view showing another exemplary change in the number of rotation of the substrate in the substrate processing.

FIG. 13 is a view showing another exemplary change in the number of rotation of the substrate 9 in part of the substrate processing. In FIG. 13, the number of rotation of the substrate 9 in the solution application process (Step S14) and the first spinning-off process (Step S15) is different from that in FIG. 4.

Specifically, in the solution application process (Step S14), the number of rotation of the substrate 9 is reduced from 1200 rpm in the immediately-preceding pure water spinning-off process to 400 rpm, and after that, is increased to 4000 rpm which is larger than that in the pure water spinning-off process. The supply of the filler solution onto the center portion of the upper surface 91 by the filler solution supply part 451 is started immediately after the number of rotation of the substrate 9 is started to decrease from 1200 rpm, continues for 0.7 seconds at a flow rate of 3 cc/sec while keeping the number of rotation of 400 rpm, and then is stopped. In the solution application process, since the number of rotation of the substrate 9 is always not smaller than 300 rpm, the spike failure is suppressed. The viscosity and the discharge flow rate of the filler solution are the same as those in the above-described processing described with reference to FIG. 4.

Herein, in the exemplary processing of FIG. 13, the period while the filler solution is supplied onto the upper surface 91 of the substrate 9 overlaps the period while the number of rotation of the substrate 9 ranges from 300 to 500 rpm. The difference in the drying rate of the solvent of the filler solution between the outer peripheral portion and the center portion of the upper surface 91 is thereby reduced, and the outer periphery film thickness failure is suppressed to some degree. After that, in the period while the number of rotation is larger than 500 rpm, the superfluous filler solution (containing pure water) on the upper surface 91 is removed like in the first spinning-off process described below.

Subsequently, in the first spinning-off process (Step S15), the number of rotation of the substrate 9 is reduced to 1500 rpm and kept for a predetermined time. The superfluous filler solution on the upper surface 91 is thereby further removed. After that, like in the exemplary processing of FIG. 4, the number of rotation of the substrate 9 is reduced to 10 rpm and kept for a predetermined time, and the filling with the filler is performed (Step S16). Then, the second spinning-off process, the edge cut process, the spin-dry process, and the bake process (Steps S17 to S20) are performed, and the processing of the substrate 9 is thereby completed. In the present exemplary processing, a film of the filler having a thickness of about 200 nm is formed.

Also in the exemplary processing of FIG. 13, after the liquid film of the pure water having a thickness not larger than 5 μm is formed, the filler solution is supplied onto the center portion of the upper surface 91 while the substrate 9 is rotated at 300 to 500 rpm. It is thereby possible to apply the filler solution onto the upper surface 91 of the substrate 9 after being subjected to the processing using the processing liquid while suppressing the occurrence of the spike failure and the outer periphery film thickness failure. Further, in the exemplary processing of FIG. 13, as compared with the exemplary processing of FIG. 4, since the time for supplying the filler solution onto the upper surface 91 is shorter, it is possible to reduce the usage of the filler solution. Furthermore, it is possible to increase the uniformity of the film thickness of the filler.

In the above-described application process using the filler solution, various modifications can be made.

Though the upper surface 91 of the substrate 9 is filled with the filler solution after the cleaning process in the above-described preferred embodiment, the filling operation using the filler solution may be performed after any of various processes (for example, an etching process) other than the cleaning process. Further, depending on the design of the substrate processing apparatus 1, the process of baking the substrate 9 may be performed by an external device.

The substrate to be subjected to the application process of the filler solution is not limited to a semiconductor substrate, a glass substrate or any other substrate may be used.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2016-222223 filed in the Japan Patent Office on Nov. 15, 2016, the entire disclosure of which is incorporated herein by reference.

REFERENCE SIGNS LIST

9 Substrate
91 Upper surface
S11 to S20 Step
The invention claimed is:
1. An application method of applying a filler solution onto a main surface of a substrate on which a pattern is formed after performing a processing on said main surface by using a processing liquid, while suppressing occurrence of a spike failure and an outer periphery film thickness failure, comprising:

a) supplying pure water onto a main surface of a substrate, which faces upward while said substrate is in a horizontal state, on which a lot of pattern elements standing upright are formed, and forming a liquid film of pure water, which covers said main surface and has a thickness not larger than 5 micrometers, by rotating said substrate, the thickness of said liquid film of pure water being larger than a height of said pattern elements on said main surface;

b) suppressing occurrence of a spike failure and an outer periphery film thickness failure by supplying a filler solution containing a water-soluble filler onto a center portion of said main surface while rotating said substrate having a diameter of 300 millimeters at the number of rotation not smaller than 300 times and not larger than 500 times per minute, said water-soluble filler containing water-soluble polymer;

c) performing a first spinning-off process where the rotation of said substrate continues after the supply of said filler solution is completed, to remove superfluous filler solution on said main surface;

d) performing a filling process where a liquid film of said filler solution is kept on said main surface in a state of stopping the supply of said filler solution, so that said filler fills clearances between said pattern elements; and e) performing a second spinning-off process where a thickness of said liquid film of said filler solution is reduced while said liquid film of said filler solution covering said main surface is kept after said filling process is completed, wherein the number of rotation of said substrate in said filling process is smaller than those in said first spinning-off process and said second spinning-off process, said filler solution has a viscosity not higher than 3.0 centipoises and not lower than 2.6 centipoises, and said filler solution is supplied onto said main surface at a flow rate not lower than 2 cubic centimeters and not higher than 3 cubic centimeters per second in said operation b).

2. The application method according to claim 1, wherein said water-soluble polymer is an acrylic resin.

3. The application method according to claim 1, wherein
said operation a) comprises a1) keeping a liquid film of pure water entirely covering said main surface, and
after said operation a1), said substrate is rotated at the number of rotation larger than the number of rotation in said operation a1), so that said liquid film of pure water having the thickness not larger than 5 micrometers and not smaller than 2 micrometers is formed.

4. An application method of applying a filler solution onto a main surface of a substrate on which a pattern is formed after performing a processing on said main surface by using a processing liquid, while suppressing occurrence of a spike failure and an outer periphery film thickness failure, comprising:

a) supplying pure water onto a main surface of a substrate, which faces upward while said substrate is in a horizontal state, on which a lot of pattern elements standing upright are formed;

b) forming a liquid film of pure water, which covers said main surface and has a thickness not larger than 5 micrometers, by rotating said substrate while stopping supply of pure water;

c) suppressing occurrence of a spike failure and an outer periphery film thickness failure by supplying a filler solution containing a water-soluble filler onto a center portion of said main surface while rotating said substrate having a diameter of 300 millimeters at the number of rotation not smaller than 300 times and not larger than 500 times per minute, said water-soluble filler containing water-soluble polymer;

d) performing a first spinning-off process where the rotation of said substrate continues after the supply of said filler solution is completed, to remove superfluous filler solution on said main surface;

e) performing a filling process where a liquid film of said filler solution is kept on said main surface in a state of stopping the supply of said filler solution, so that said filler fills clearances between said pattern elements; and f) performing a second spinning-off process where a thickness of said liquid film of said filler solution is reduced while said liquid film of said filler solution covering said main surface is kept after said filling process is completed, wherein the number of rotation of said substrate in said filling process is smaller than those in said first spinning-off process and said second spinning-off process, said filler solution has a viscosity not higher than 3.0 centipoises and not lower than 2.6 centipoises, and said filler solution is supplied onto said main surface at a flow rate not lower than 2 cubic centimeters and not higher than 3 cubic centimeters per second in said operation c).

5. The application method according to claim 4, wherein in said operation b), the thickness of said liquid film of pure water is reduced while said liquid film of pure water entirely covering said main surface is kept.

6. The application method according to claim 4, wherein in said operation c), pure water is supplied onto a lower surface of said substrate.

7. The application method according to claim 4, wherein said water-soluble polymer is an acrylic resin.

8. The application method according to claim 4, wherein
said operation a) comprises a1) keeping a liquid film of pure water entirely covering said main surface, and
in said operation b), said substrate is rotated at the number of rotation larger than the number of rotation in said operation a1), so that said liquid film of pure water having the thickness not larger than 5 micrometers and not smaller than 2 micrometers is formed.

* * * * *